(12) United States Patent
Kubota et al.

(10) Patent No.: US 9,455,589 B2
(45) Date of Patent: Sep. 27, 2016

(54) POWER SUPPLY APPARATUS AND POWER SUPPLY DEGRADATION DIAGNOSIS METHOD

(71) Applicant: FUJITSU LIMITED, Kawasaki-shi, Kanagawa (JP)

(72) Inventors: Ryo Kubota, Kitaku (JP); Yohei Nuno, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 174 days.

(21) Appl. No.: 14/548,336

(22) Filed: Nov. 20, 2014

(65) Prior Publication Data

US 2015/0160299 A1 Jun. 11, 2015

(30) Foreign Application Priority Data

Dec. 6, 2013 (JP) .................................. 2013-252840

(51) Int. Cl.
| | |
|---|---|
| G01R 31/36 | (2006.01) |
| H02J 7/00 | (2006.01) |
| G01R 31/40 | (2014.01) |
| G06F 1/26 | (2006.01) |
| H02J 7/34 | (2006.01) |

(52) U.S. Cl.
CPC ........... *H02J 7/007* (2013.01); *G01R 31/3679* (2013.01); *G01R 31/40* (2013.01); *G06F 1/26* (2013.01); *H02J 7/345* (2013.01)

(58) Field of Classification Search
CPC  G01R 31/002; G01R 31/016; G01R 31/028; G01R 31/24; G01R 31/3679; G01R 31/40; G06F 1/26; F02P 2017/006; H02J 7/007; H02J 7/345
USPC .......... 324/548, 537, 500, 382, 403, 750.01, 324/718; 320/127, 128, 134, 135, 136, 166, 320/167; 702/1, 35, 57
See application file for complete search history.

(56) References Cited

U.S. PATENT DOCUMENTS

| | | | | |
|---|---|---|---|---|
| 6,265,981 B1* | 7/2001 | Carson | ................. | G08B 13/122 340/635 |
| 8,427,182 B2* | 4/2013 | Amanuma | ......... | G01R 31/2839 307/115 |
| 8,461,849 B1* | 6/2013 | Almonte | .............. | G01R 31/016 324/548 |
| 2010/0007361 A1* | 1/2010 | Yamanaka | ................ | H02J 1/14 324/678 |
| 2012/0223670 A1* | 9/2012 | Kinjo | ........................ | H02J 3/32 320/103 |
| 2013/0314095 A1* | 11/2013 | Nakashima | ........ | G01R 31/3679 324/433 |
| 2013/0335009 A1* | 12/2013 | Katsumata | ............ | H02J 7/0042 320/107 |

FOREIGN PATENT DOCUMENTS

| | | |
|---|---|---|
| JP | 07-055901 | 3/1995 |
| JP | 10-002943 | 1/1998 |

\* cited by examiner

*Primary Examiner* — Hoai-An D Nguyen
(74) *Attorney, Agent, or Firm* — Fujitsu Patent Center (57) ABSTRACT

A power supply apparatus includes a first electric accumulator, a second electric accumulator, and a control section which controls charge and discharge of the first electric accumulator and the second electric accumulator. When the control section does not carry out a degradation diagnosis of the first electric accumulator, the control section charges the first electric accumulator and makes the second electric accumulator discharge. When the control section carries out the degradation diagnosis of the first electric accumulator, the control section charges the second electric accumulator and then makes the first electric accumulator begin to discharge for the degradation diagnosis.

8 Claims, 11 Drawing Sheets

(sw1, sw2, sw3) = (ON, OFF, OFF)

POWER SUPPLY APPARATUS AND POWER SUPPLY DEGRADATION DIAGNOSIS METHOD

CROSS-REFERENCE TO RELATED APPLICATION

This application is based upon and claims the benefit of priority of the prior Japanese Patent Application No. 2013-252840, filed on Dec. 6, 2013, the entire contents of which are incorporated herein by reference.

FIELD

The embodiment discussed herein is related to a power supply apparatus and a power supply degradation diagnosis method.

BACKGROUND

SCUs (System Capacitor Units) which are power supplies for backing up data are included in power supply sections of information processing apparatus such as servers.

A SCU is in a charged state during normal operation of a system. Furthermore, when the supply of power to the system is stopped due to a power failure or the like, power is supplied from the SCU to save data stored in a volatile memory, such as a cache memory, in a nonvolatile memory. By doing so, the cache data is conserved.

On the other hand, the SCU secures power for backing up data by utilizing charge and discharge of a condenser (also referred to as a capacitor). As a result, repeating charge and discharge causes degradation. Accordingly, in order to improve reliability, a degraded state is regularly diagnosed.

Formerly the technique of randomly selecting a secondary battery cell column on which a discharge capacity test is to be performed from a battery pack in which a plurality of secondary battery cell columns are connected was proposed as a technique for diagnosing a backup power supply. Furthermore, the technique of separating a redundant secondary battery cell column from a battery pack in which a plurality of secondary battery cell columns are connected and determining a discharge power amount of the separated secondary battery cell column was proposed.
Japanese Laid-open Patent Publication No. 10-2943
Japanese Laid-open Patent Publication No. 07-55901

When a degradation diagnosis of a SCU is performed, a condenser discharges. Accordingly, the amount of power obtained by charging decreases. It takes a certain period to complete charging after the degradation diagnosis. If a power failure or the like occurs in this period, the amount of power may be insufficient for backup. As a result, backup may not be performed normally.

In order to prevent deterioration in reliability caused by lack of the amount of power, for example, the number of condensers may be increased. By doing so, the amount of power which decreases by performing a degradation diagnosis is always secured excessively. However, this causes an increase in the number of condensers included. An increase in the number of condensers leads to an increase in the size of a SCU. An increase in the size of a SCU means an increase in the number of restrictions on the installation of the SCU and an increase in the costs and therefore is undesirable. Even if a battery is used in place of a condenser as an electric accumulator for storing electric charges, the same problem arises.

SUMMARY

According to an aspect, there is provided a power supply apparatus including a first electric accumulator, a second electric accumulator, and a control section which controls charge and discharge of the first electric accumulator and the second electric accumulator so as to charge the first electric accumulator and make the second electric accumulator discharge at the time of not performing a degradation diagnosis of the first electric accumulator and so as to charge the second electric accumulator at the time of performing the degradation diagnosis of the first electric accumulator and make, after charging the second electric accumulator, the first electric accumulator begin to discharge for the degradation diagnosis.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Figure 1:
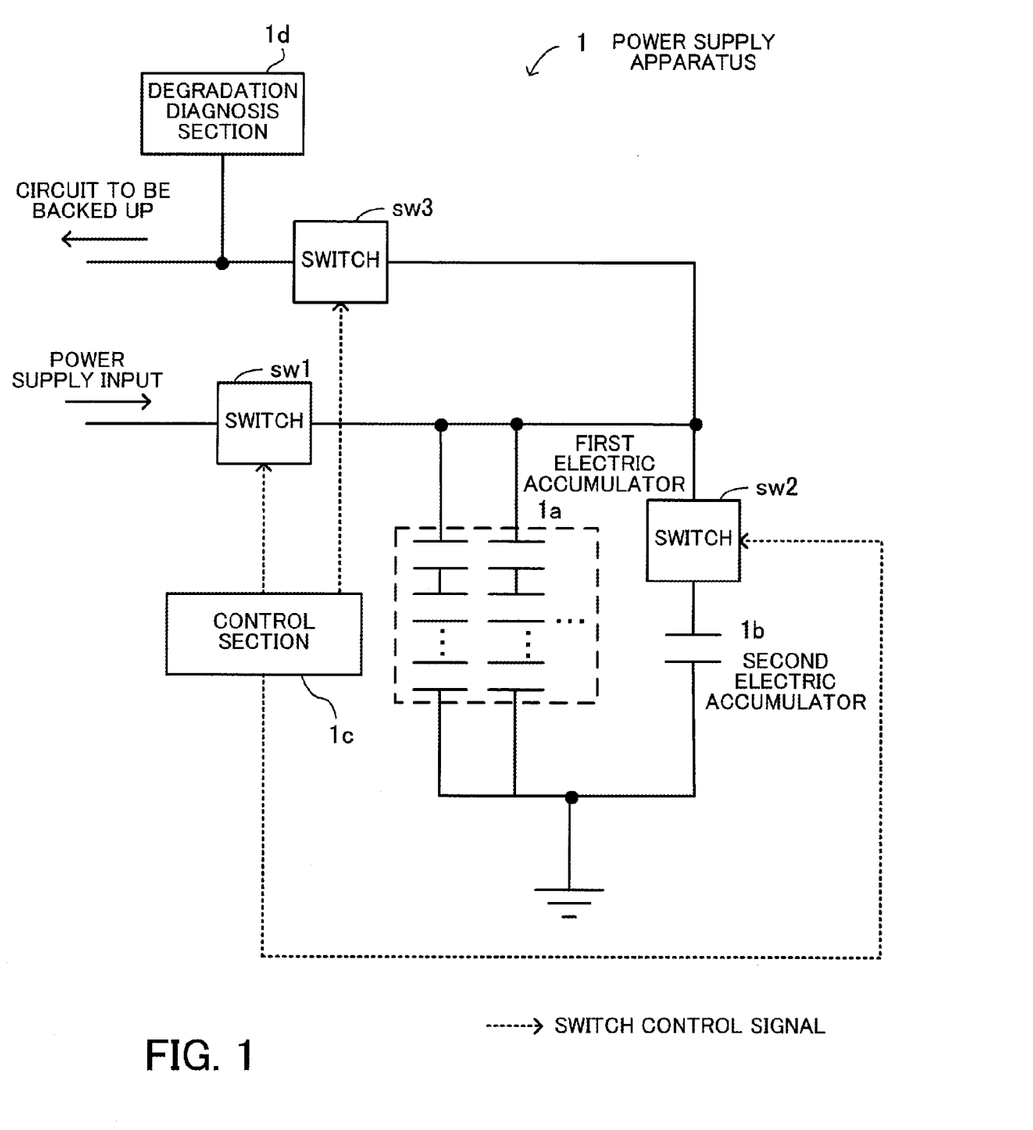
FIG. 1 illustrates an example of the structure of a power supply apparatus.

An embodiment will now be described with reference to the accompanying drawings, wherein like reference numerals refer to like elements throughout. FIG. 1 illustrates an example of the structure of a power supply apparatus. For example, when the supply of power from a main power supply is shut off, a power supply apparatus 1 is used as an emergency power supply for backing up a circuit to be backed up which backs up data. The power supply apparatus 1 includes a first electric accumulator 1a, a second electric accumulator 1b, a control section 1c, a degradation diagnosis section 1d, and switches sw1 through sw3.

When the supply of power from the main power supply is shut off, the first electric accumulator 1a supplies power for backup to the circuit to be backed up by discharging electric charges stored by charging. For example, the first electric accumulator 1a stores electricity by a plurality of condensers. Alternatively, a battery may be used as the first electric accumulator 1a.

The second electric accumulator 1b is used for supplementing the charge capacity of the first electric accumulator 1a. For example, the second electric accumulator 1b is a single condenser. Alternatively, a battery may be used as the second electric accumulator 1b.

Terminals of the first electric accumulator 1a and the second electric accumulator 1b on a side which is not connected to the switches are connected to GND (ground).

The degradation diagnosis section 1d diagnoses a degraded state of the first electric accumulator 1a.

The control section 1c controls charge and discharge of the first electric accumulator 1a and the second electric accumulator 1b. For example, when the control section 1c does not carry out a degradation diagnosis of the first electric accumulator 1a, the control section 1c charges the first electric accumulator 1a and makes the second electric accumulator 1b discharge. When the control section 1c carries out a degradation diagnosis of the first electric accumulator 1a, the control section 1c charges the second electric accumulator 1b. After charging the second electric accumulator 1b, the control section 1c makes the first electric accumulator 1a begin to discharge for the degradation diagnosis. Control over charge and discharge of the first electric accumulator 1a and the second electric accumulator 1b by the control section 1c is realized by, for example, control over the opening and closing of the switches sw1 through sw3.

Of the switches sw1 through sw3 included in the power supply apparatus 1, the switch sw1 (first switch) performs switching of power supply input. An input end of the switch sw1 is connected to an input power supply line and an output end of the switch sw1 is connected to one end of the first electric accumulator 1a, one end of the switch sw2, and an input end of the switch sw3.

The switch sw2 (second switch) performs switching of charge and discharge of the second electric accumulator 1b. The other end of the switch sw2 is connected to one end of the second electric accumulator 1b.

The switch sw3 (third switch) performs switching of supply of electric charges discharged by the first electric accumulator 1a to the circuit to be backed up and switching of input of electric charges discharged by the first electric accumulator 1a to the degradation diagnosis section 1d. An output end of the switch sw3 is connected to the circuit to be backed up and an input end of the degradation diagnosis section 1d.

A switch control signal outputted from the control section 1c is inputted to a switch control terminal of each of the switches sw1 through sw3. By doing so, on(close)-off(open) switching of each switch is performed on the basis of the switch control signal.

As has been described, with the power supply apparatus 1 a discharge power amount from the first electric accumulator 1a at the time of carrying out a degradation diagnosis of the first electric accumulator 1a is supplemented in advance in the second electric accumulator 1b. By adopting this method, the second electric accumulator 1b is charged. As a result, a discharge power amount from the first electric accumulator 1a used for a degradation diagnosis is supplemented. Accordingly, there is no need to increase the capacity of the first electric accumulator 1a only for degradation diagnosis. In addition, the second electric accumulator 1b is not always kept in a charged state. That is to say, the second electric accumulator 1b is temporarily charged at degradation diagnosis time. As a result, the second electric accumulator 1b is degraded slowly compared with the first electric accumulator 1a. This makes it possible to charge the second electric accumulator 1b to a high voltage. Charging the second electric accumulator 1b to a high voltage means that even if its electrostatic capacity is low, it can store a large power (energy) amount. Therefore, for example, one condenser will do for the second electric accumulator 1b. This makes it possible to check an increase in the size of the whole of the power supply apparatus 1 while securing reliability by degradation diagnosis.

Furthermore, the power supply apparatus 1 includes the switches sw1 through sw3. The flow of a signal regarding charge or discharge is controlled by controlling switching of these switches, so a backup power supply is realized by simple circuit structure. The concrete contents of switching will be described later.

An example of an information processing apparatus including the function of the power supply apparatus 1 will now be described in detail. The structure of an information processing apparatus 10 will be described first.

Figure 2:
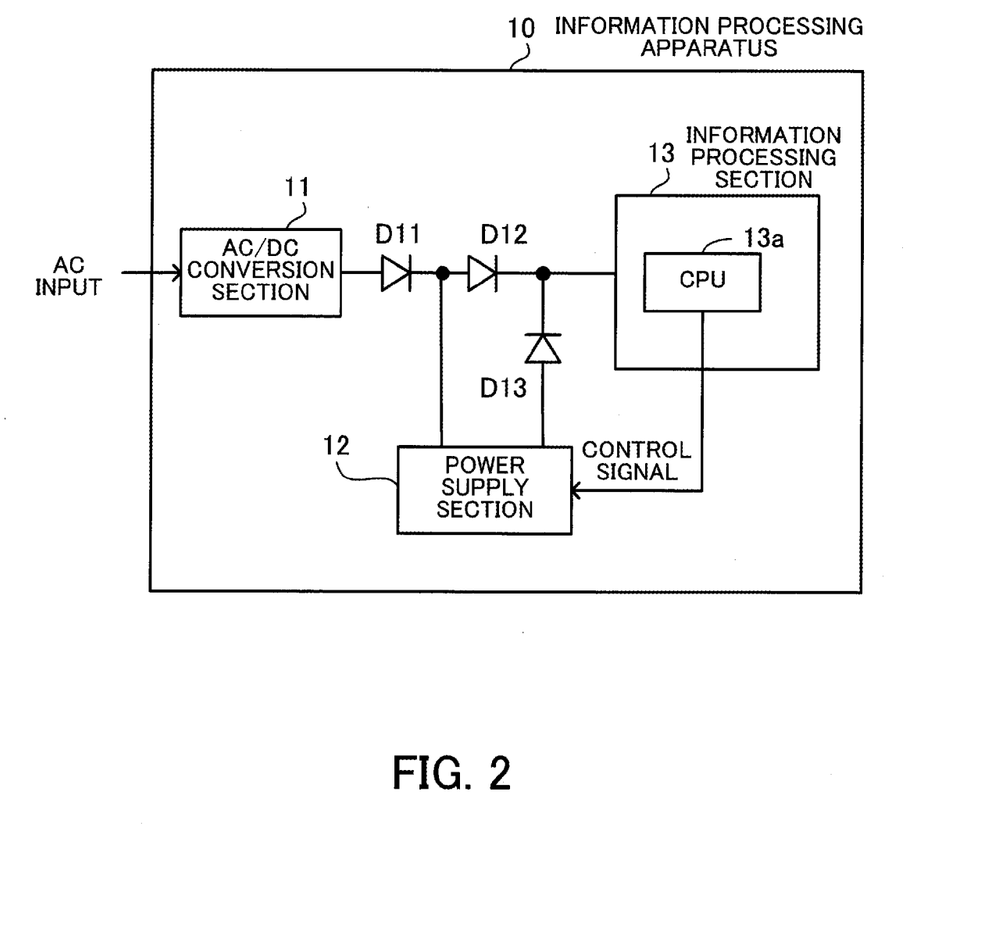
FIG. 2 illustrates an example of the structure of an information processing apparatus.

FIG. 2 illustrates an example of the structure of an information processing apparatus. The information processing apparatus 10 includes an AC (Alternating Current)/DC (Direct Current) conversion section 11, diodes D11 through D13, a power supply section 12, and an information processing section 13. The power supply section 12 has the function of the power supply apparatus 1 illustrated in FIG. 1.

Connections around the diodes D11 through D13 are as follows. An anode of the diode D11 is connected to an output end of the AC/DC conversion section 11. A cathode of the diode D11 is connected to an anode of the diode D12 and an end of the power supply section 12 to which a power supply signal is inputted.

A cathode of the diode D12 is connected to an end of the information processing section 13 to which a power supply signal is inputted and a cathode of the diode D13. An anode of the diode D13 is connected to an end of the power supply section 12 from which a power supply signal is outputted.

The AC/DC conversion section 11 converts a power supply signal, which is AC input, into a DC signal. The DC signal is supplied to the power supply section 12 and the information processing section 13. In this case, the DC signal which has passed through the diode D11 is supplied to the power supply section 12. Furthermore, the DC signal which has passed through the diodes D11 and D12 is supplied to the information processing section 13.

The power supply section 12 functions as a backup power supply of the information processing section 13. The power supply section 12 is, for example, a SCU and supplies a power supply signal for backup at backup time to the information processing section 13 to be backed up. In this case, the power supply signal for backup passes through the diode D13 and is supplied to the information processing section 13. Furthermore, the power supply section 12 performs setting of operation, such as degradation diagnosis thereof, on the basis of a control signal transmitted from the information processing section 13.

The information processing section 13 includes a CPU (Central Processing Unit) 13a. The CPU 13a performs information processing. Furthermore, the CPU 13a outputs a control signal for giving the power supply section 12 instructions to perform setting of operation.

Figure 3:
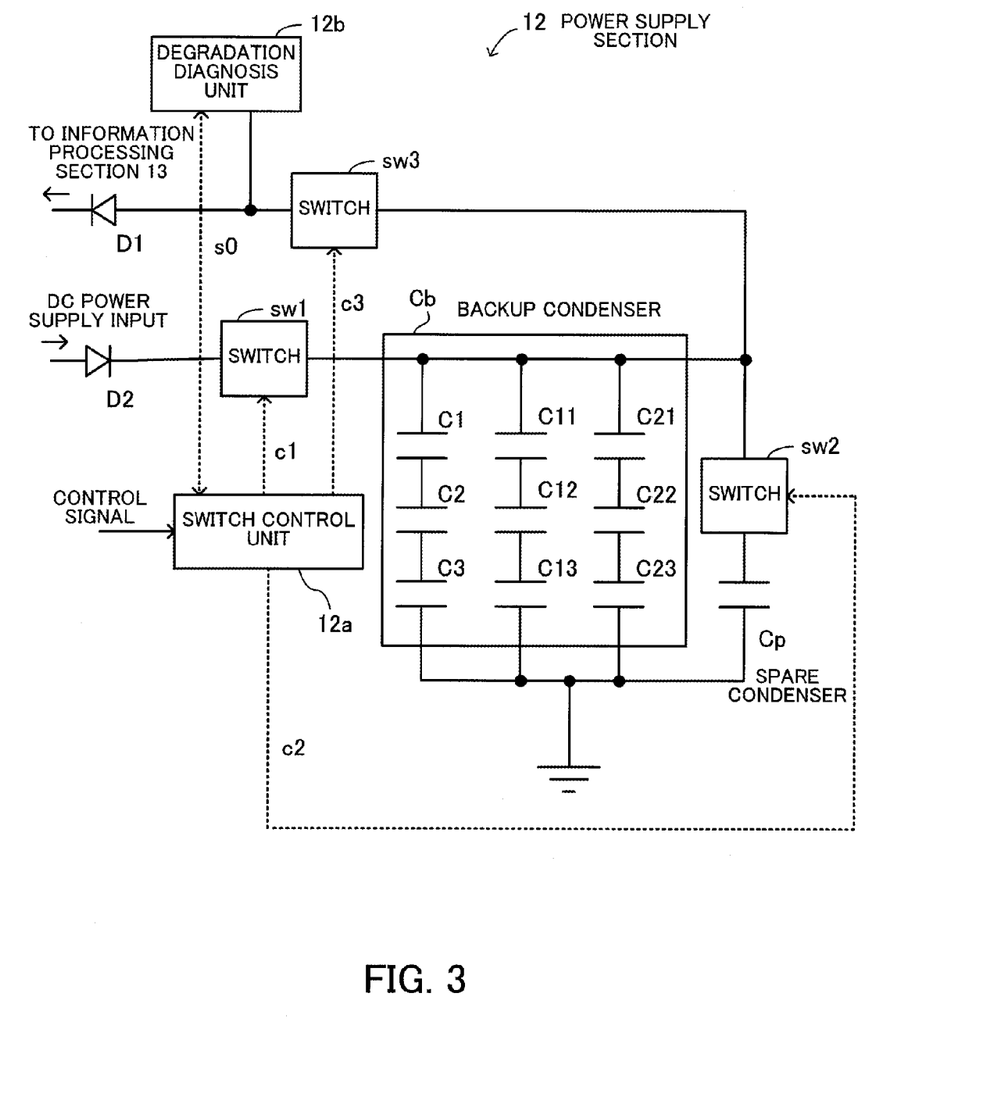
FIG. 3 illustrates an example of the structure of a power supply section.

FIG. 3 illustrates an example of the structure of the power supply section. The power supply section 12 includes diodes D1 and D2, switches sw1 through sw3, a backup condenser Cb, a spare condenser Cp, a switch control unit 12a, and a degradation diagnosis unit 12b.

The backup condenser Cb includes condensers C1 through C3, C11 through C13, and C21 through C23. For example, MOSFETs (Metal Oxide Semiconductor Field Effect Transistors) are used as the switches sw1 through sw3.

Each component is connected in the following way. A cathode of the diode D1 is connected to the information processing section 13 to be backed up. An anode of the diode D1 is connected to an input end (terminal to which a discharge signal from a condenser is inputted) of the degradation diagnosis unit 12b and an output end of the switch sw3.

An anode of the diode D2 is connected to an output end of the AC/DC conversion section 11. A DC signal outputted from the AC/DC conversion section 11 is inputted to the anode of the diode D2. A cathode of the diode D2 is connected to an input end of the switch sw1.

An output end of the switch sw1 is connected to an input end of the switch sw3, one end of the switch sw2, and one end of each of the condensers C1, C11, and C21. The other end of the switch sw2 is connected to one end of the condenser Cp. The other end of each of the condensers C3, C13, and C23 and the other end of the condenser Cp are connected to GND.

The condensers C1 through C3 are connected in series, the condensers C11 through C13 are connected in series, and the condensers C21 through C23 are connected in series. Furthermore, when the switch sw2 is closed, the condensers C1 through C3, the condensers C11 through C13, the condensers C21 through C23, and the condenser Cp are connected in parallel.

The switch control unit 12a receives a control signal outputted from the CPU 13a and outputs switch control signals c1 through c3 to the switches sw1 through sw3, respectively, for exercising switching control. In addition, the switch control unit 12a exercises control for monitoring a charged state of the spare condenser Cp.

State notice is exchanged between the switch control unit 12a and the degradation diagnosis unit 12b by the use of a state signal s0. For example, on the basis of an on or off state of each of the switches sw1 through sw3, the switch control unit 12a may give the degradation diagnosis unit 12b instructions to begin a degradation diagnosis. Furthermore, the degradation diagnosis unit 12b may give the switch control unit 12a notice of the end of a degradation diagnosis. In such cases, the state signal s0 is used.

On the other hand, the information processing section 13 or an upper module, a maintenance terminal, or the like (not illustrated) is informed of the result of a degradation diagnosis carried out by the degradation diagnosis unit 12b, a state in which each switch is driven by the switch control unit 12a, the charged state of the spare condenser Cp monitored by the switch control unit 12a, and the like (including giving an alarm).

Figure 4:
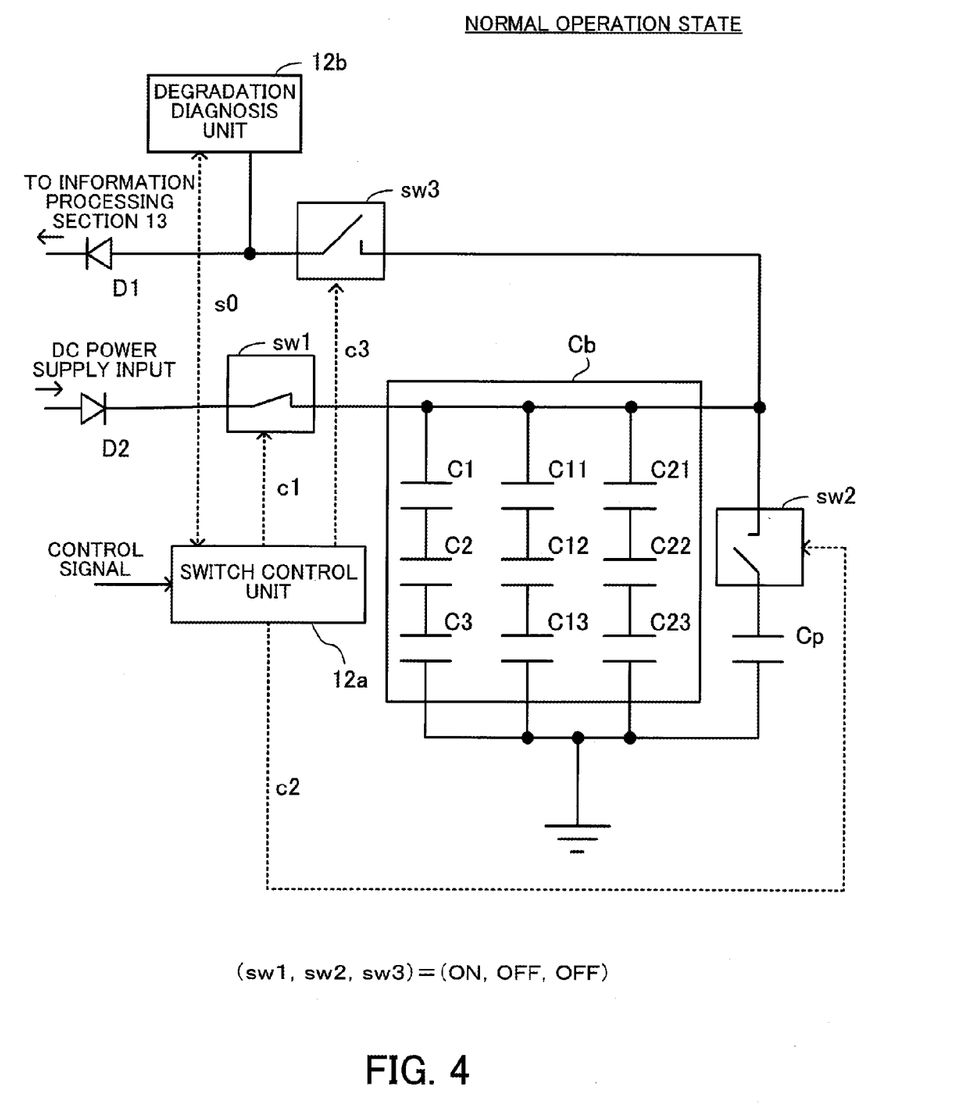
FIG. 4 illustrates the state of each switch.

The state of each of the switches sw1 through sw3 will now be described. FIG. 4 illustrates the state of each switch. FIG. 4 illustrates the state of each of the switches sw1 through sw3 in a normal operation state of the information processing apparatus 10.

In the normal operation state of the information processing apparatus 10, the switch s1 is in an on state and the switches s2 and s3 are in an off state. In the case, the condensers C1 through C3, C11 through C13, and C21 through C23 included in the backup condenser Cb are charged by a DC input signal for backing up the information processing section 13. The spare condenser Cp is in a state in which it is not yet charged.

Figure 5:
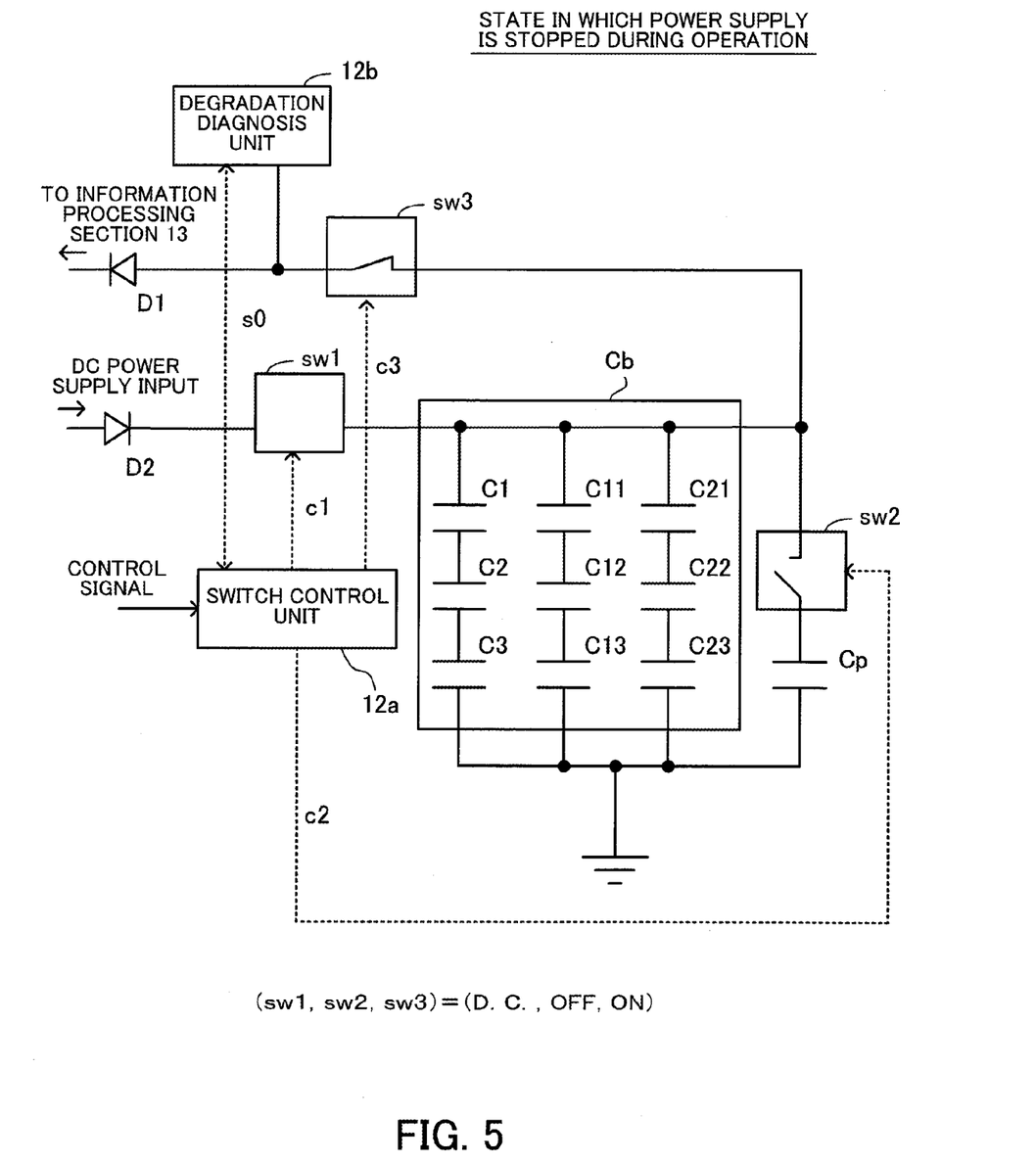
FIG. 5 illustrates the state of each switch.

FIG. 5 illustrates the state of each switch. FIG. 5 illustrates the state of each of the switches sw1 through sw3 in a state in which power supply is stopped due to a power failure or the like during the normal operation of the information processing apparatus 10.

In a state in which power supply is stopped during the normal operation of the information processing apparatus 10, the switch sw1 is D.C. (Don't Care, that is to say, an undefined state in which either of an on state and an off state will do), the switch sw2 is in an off state, and the switch sw3 is in an on state.

In this case, the condensers C1 through C3, C11 through C13, and C21 through C23 included in the backup condenser Cb discharge and electric charges discharged at this time flow to the information processing section 13 via the switch sw3. As a result, power for backup is supplied to the information processing section 13.

Figure 6:
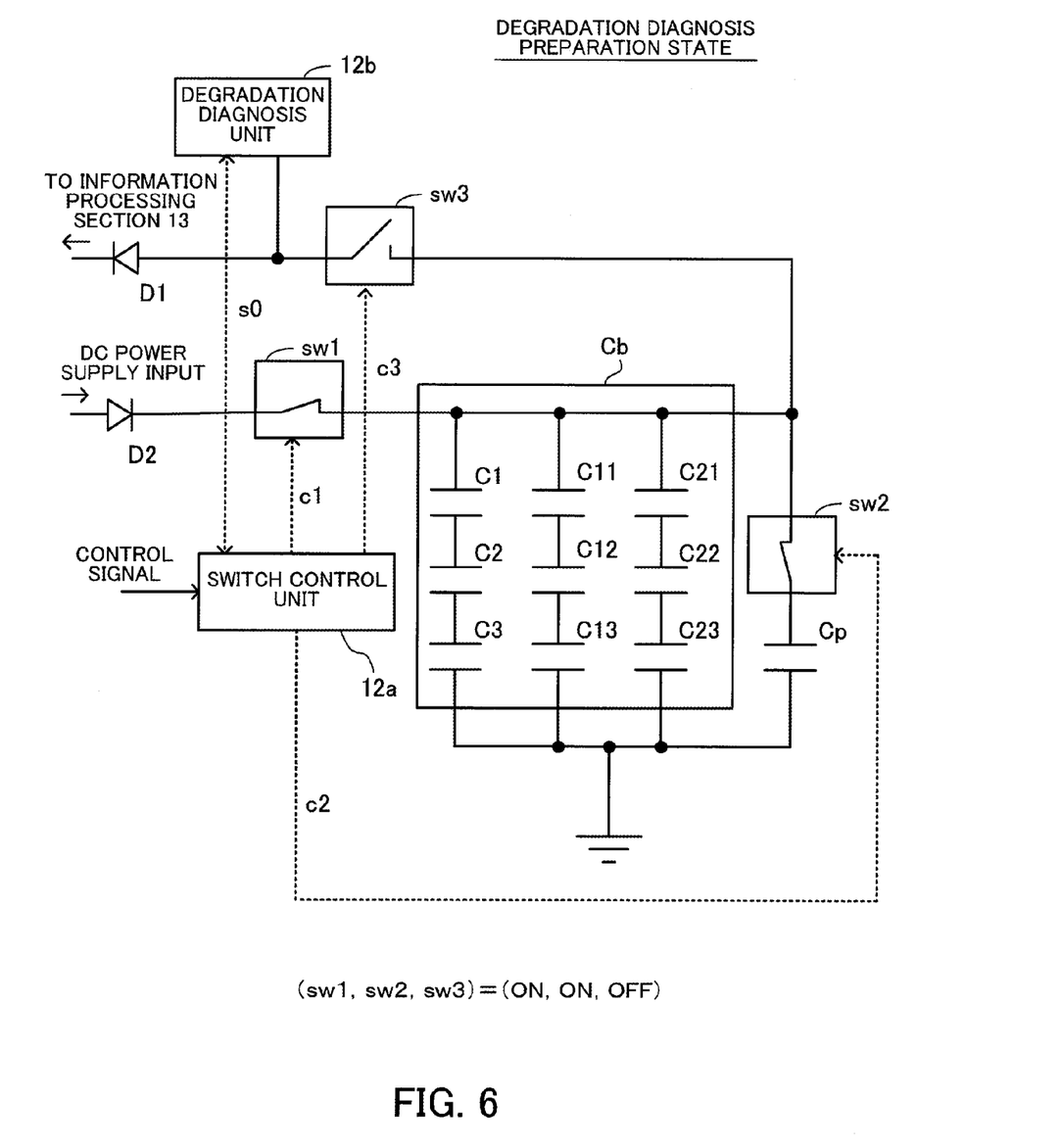
FIG. 6 illustrates the state of each switch.

FIG. 6 illustrates the state of each switch. FIG. 6 illustrates the state of each of the switches sw1 through sw3 in a degradation diagnosis preparation state before the performance of a degradation diagnosis of the backup condenser Cb.

In the degradation diagnosis preparation state, the switches sw1 and sw2 are in an on state and the switch sw3 is in an off state. In this case, the spare condenser Cp is charged. The backup condenser Cb is also charged.

In the degradation diagnosis preparation state, as stated above, the switch sw2 is in an on state, so the spare condenser Cp is charged. By doing so, a discharge power amount from the backup condenser Cb at degradation diagnosis time is supplemented. By exercising such switching control, the charge capacity of the spare condenser Cp is adaptively secured. This reduces the number of condensers.

Figure 7:
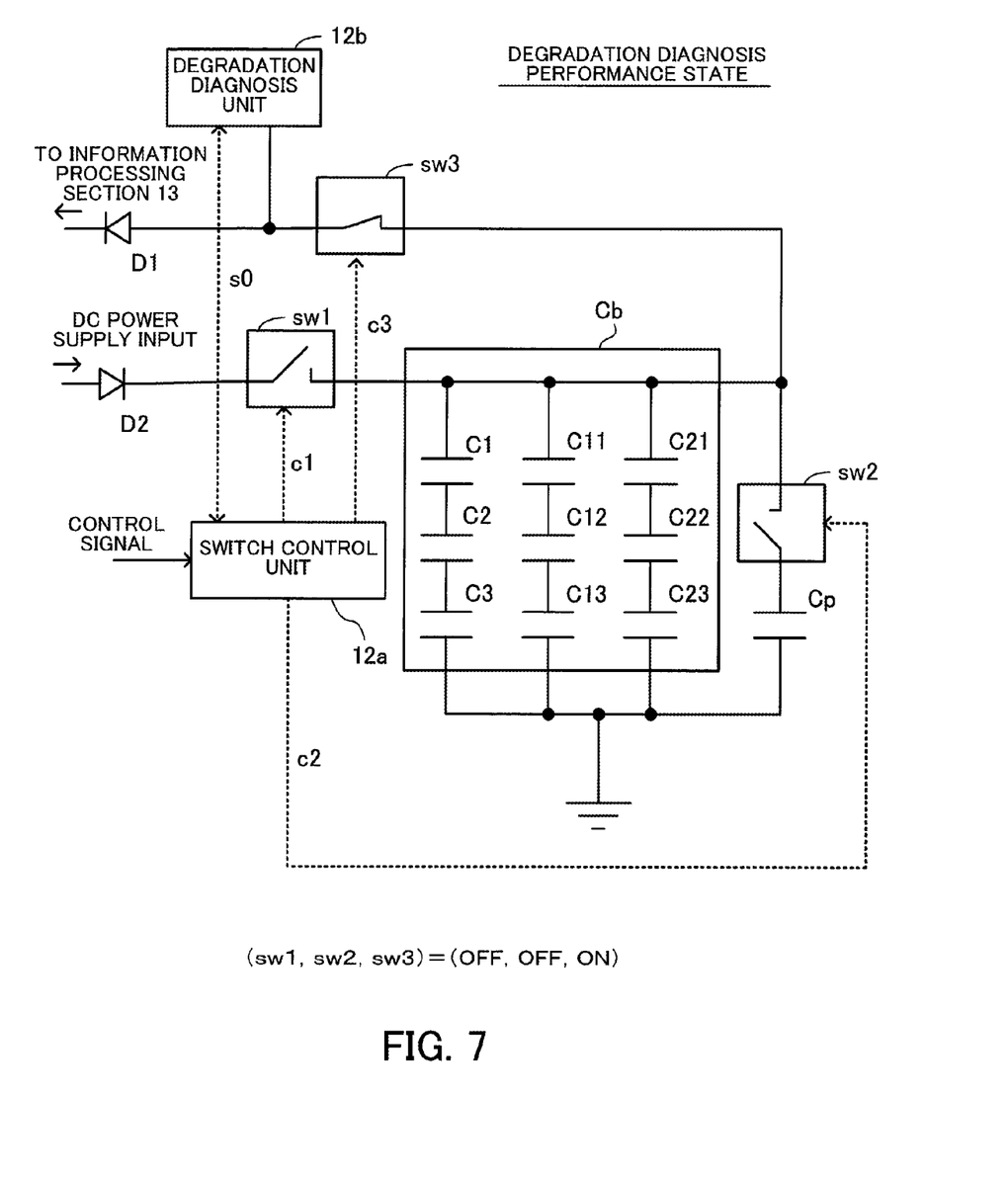
FIG. 7 illustrates the state of each switch.

FIG. 7 illustrates the state of each switch. FIG. 7 illustrates the state of each of the switches sw1 through sw3 in a state in which a degradation diagnosis of the backup condenser Cb is performed.

In the state in which a degradation diagnosis of the backup condenser Cb is performed, the switches sw1 and sw2 are in an off state and the switch sw3 is in an on state. In this case, the condensers C1 through C3, C11 through C13, and C21 through C23 included in the backup condenser Cb discharge and electric charges discharged are inputted to the degradation diagnosis unit 12b via the switch sw3.

At this time the switch control unit 12a uses the state signal s0 for giving the degradation diagnosis unit 12b instructions to begin a degradation diagnosis. The degradation diagnosis unit 12b then determines the electrostatic capacity of the backup condenser Cb, for example, from a fall in voltage caused by constant-current discharge of the backup condenser Cb to diagnose a degraded state of the backup condenser Cb. Alternatively, the degradation diagnosis unit 12b may determine DCR (direct-current resistance) from the fall in voltage to diagnose a degraded state of the backup condenser Cb.

The switch sw2 is in an off state, so power supply input to the spare condenser Cp is shut off. As a result, after that the spare condenser Cp self-discharges and electric charges stored in the spare condenser Cp are gradually lost for a certain period. However, a sufficient power amount is held in the spare condenser Cp within degradation diagnosis time. A sufficient power amount is, for example, a power amount equal to a power amount lost from the backup condenser Cb for a degradation diagnosis.

As has been described, in the state in which a degradation diagnosis of the backup condenser Cb is performed, the switch sw3 is in an on state. Accordingly, electric charges discharged by the backup condenser Cb are inputted to the degradation diagnosis unit 12b and a degradation diagnosis of the backup condenser Cb is performed. By exercising such switching control, a degradation diagnosis of the backup condenser Cb is performed easily.

Figure 8:
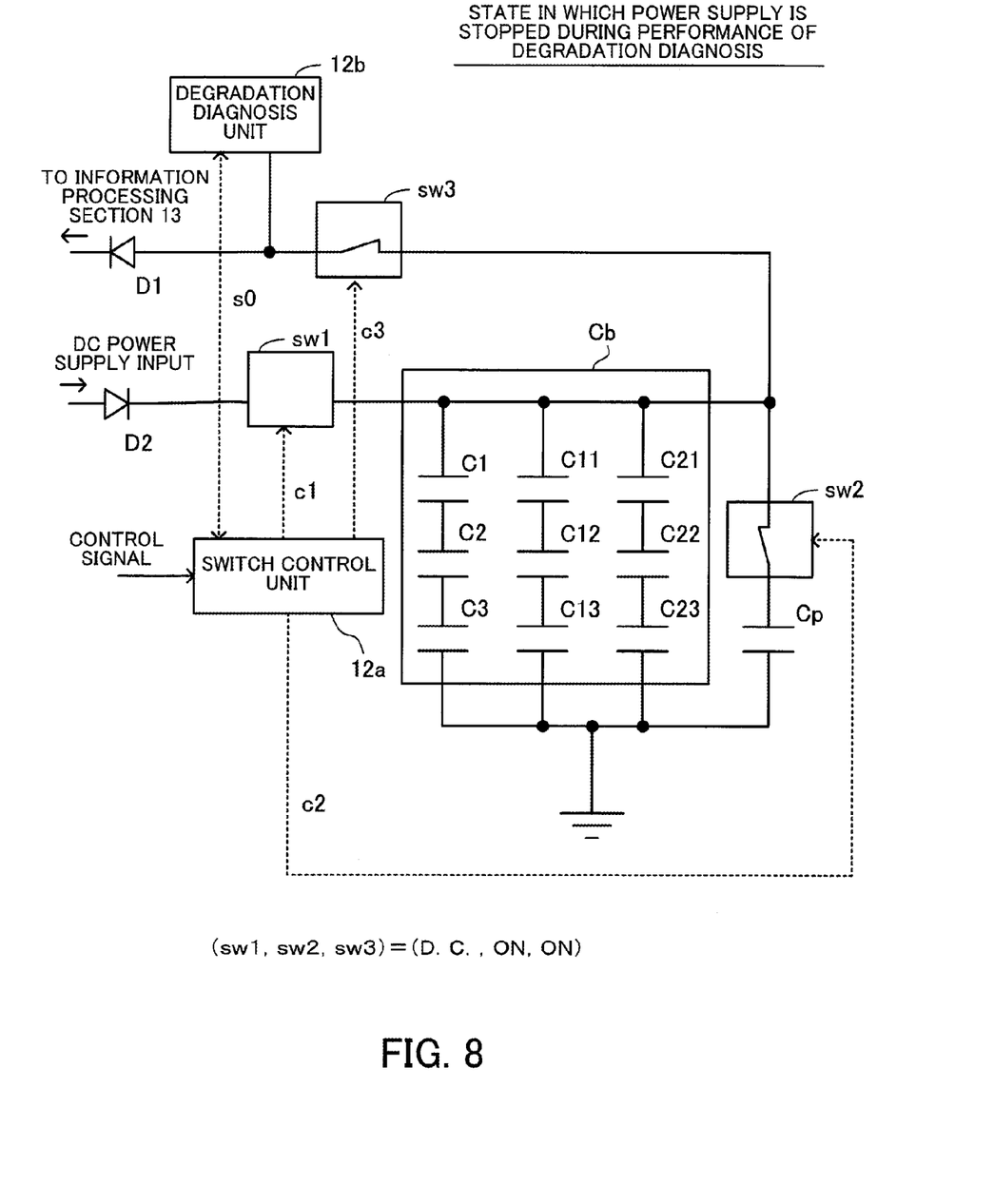
FIG. 8 illustrates the state of each switch.

FIG. 8 illustrates the state of each switch. FIG. 8 illustrates the state of each of the switches sw1 through sw3 in a state in which power supply is stopped due to a power failure or the like during the performance of a degradation diagnosis of the backup condenser Cb.

In the state in which power supply is stopped during the performance of a degradation diagnosis of the backup condenser Cb, the switch sw1 is D. C., the switch sw2 is in an on state, and the switch sw3 is in an on state. In this case, the degradation diagnosis unit 12b stops the degradation diagnosis.

Furthermore, the condensers C1 through C3, C11 through C13, and C21 through C23 included in the backup condenser Cb and the spare condenser Cp discharge and electric charges discharged at this time by them flow to the information processing section 13 to back up the information processing section 13.

As has been described, if power supply is stopped during the performance of a degradation diagnosis of the backup condenser Cb, then the degradation diagnosis is stopped and both of the backup condenser Cb and the spare condenser Cp discharge.

The backup condenser Cb discharges during the performance of a degradation diagnosis of the backup condenser Cb. As a result, if a power failure occurs during the performance of the degradation diagnosis of the backup condenser Cb, a power amount alone which remains in the backup condenser Cb may be insufficient for power for backup.

In this embodiment, on the other hand, electric charges discharged by the spare condenser Cp charged before a degradation diagnosis also flow to the information processing section 13 to be backed up. The spare condenser Cp is charged in the degradation diagnosis preparation state and self-discharges at the time of the performance of the degradation diagnosis. However, the spare condenser Cp self-discharges for a certain period. Accordingly, if a power failure occurs during the performance of the degradation diagnosis of the backup condenser Cb, then a power amount which is not discharged by self-discharge can be used.

That is to say, if a power failure occurs during the performance of the degradation diagnosis of the backup condenser Cb, then a remaining power amount in the backup condenser Cb after a decrease in power amount caused by the performance of the degradation diagnosis and a remaining power amount in the spare condenser Cp after a decrease in power amount caused by self-discharge are summed by switching control and are used as power for backup. As a result, even if power supply is stopped due to a power failure or the like during the performance of the degradation diagnosis of the backup condenser Cb, power for backup is supplied.

Figure 9:
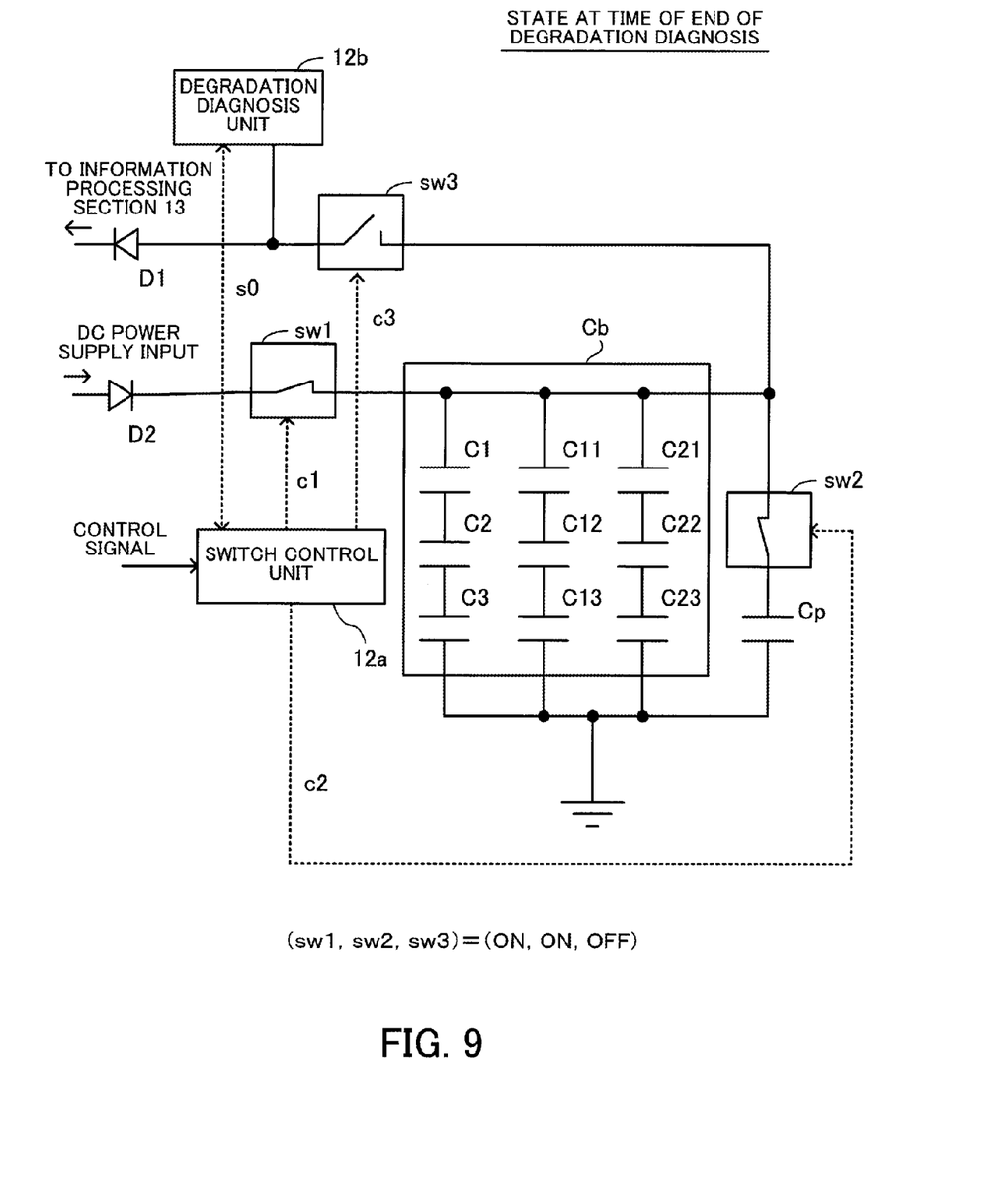
FIG. 9 illustrates the state of each switch.

FIG. 9 illustrates the state of each switch. FIG. 9 illustrates the state of each of the switches sw1 through sw3 at the time when a degradation diagnosis of the backup condenser Cb ends.

In a degradation diagnosis end state, the switch sw1 is in an on state, the switch sw2 is in an on state, and the switch sw3 is in an off state. In this case, the condensers C1 through C3, C11 through C13, and C21 through C23 included in the backup condenser Cb are charged by a DC input signal. The spare condenser Cp is also charged by the DC input signal.

Furthermore, when the switch control unit 12a recognizes that the spare condenser Cp has been charged, the switch control unit 12a turn off the switch sw2. By doing so, the switch control unit 12a shuts off power supply input to the spare condenser Cp and makes the spare condenser Cp self-discharge (state of each switch illustrated in FIG. 4 is realized).

As has been described, if the degradation diagnosis of the backup condenser Cb has ended, both of the backup condenser Cb and the spare condenser Cp are charged by switching control. Therefore, even if power supply is stopped due to a power failure or the like after the degradation diagnosis of the backup condenser Cb has ended, power for backup is secured.

Figure 10:
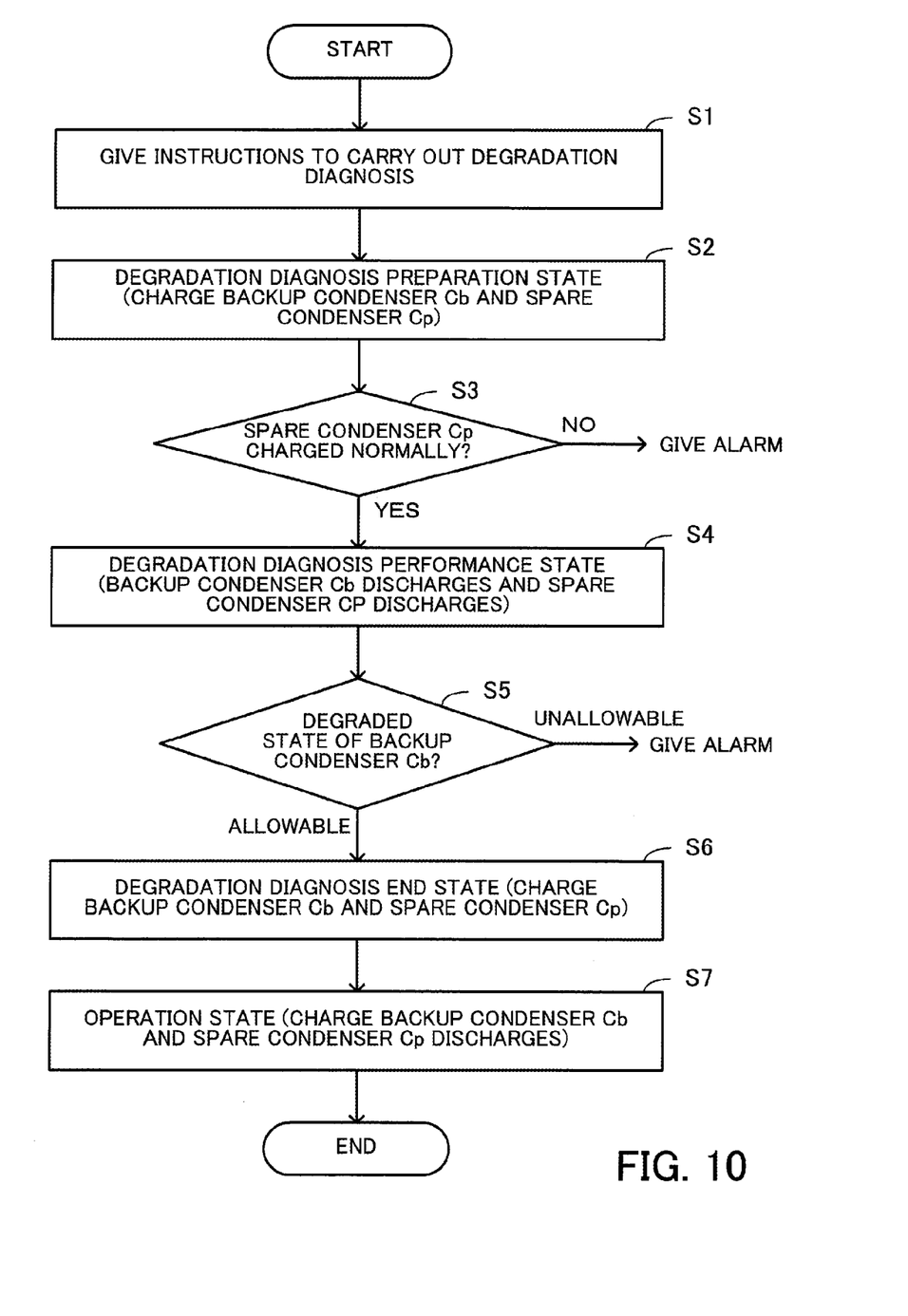
FIG. 10 is a flow chart of switching control.

Switching control related to degradation diagnosis will now be described by the use of a flow chart. FIG. 10 is a flow chart of switching control.

(S1) The CPU 13a included in the information processing section 13 transmits to the power supply section 12 a control signal including instructions to carry out a degradation diagnosis of the backup condenser Cb.

(S2) When the switch control unit 12a receives the control signal, the switch control unit 12a exercises switching control for carrying out a degradation diagnosis of the backup condenser Cb. First the switch control unit 12a puts the switches sw1 through sw3 into a degradation diagnosis preparation state (FIG. 6).

In this case, the switch control unit 12a turns on the switch sw1 by a switch control signal c1, turns on the switch sw2 by a switch control signal c2, and turns off the switch sw3 by a switch control signal c3. Both of the backup condenser Cb and the spare condenser Cp are charged.

(S3) The switch control unit 12a determines whether or not the spare condenser Cp has been charged normally. If the spare condenser Cp has been charged normally, then the switch control unit 12a proceeds to step S4. If the spare condenser Cp has not been charged normally, then the switch control unit 12a gives an alarm.

(S4) The switch control unit 12a puts the switches sw1 through sw3 into a degradation diagnosis performance state (FIG. 7).

In this case, the switch control unit 12a turns off the switch sw1 by the switch control signal c1, turns off the switch sw2 by the switch control signal c2, and turns on the switch sw3 by the switch control signal c3. Electric charges stored in the backup condenser Cb are inputted to the degradation diagnosis unit 12b and electric charges stored in the spare condenser Cp are self-discharged slowly.

(S5) The degradation diagnosis unit 12b carries out a degradation diagnosis of the backup condenser Cb by the use of power discharged by the backup condenser Cb. If a degraded state of the backup condenser Cb is in a tolerance range from the result of the diagnosis, then step S6 is performed. If a degraded state of the backup condenser Cb is not in the tolerance range, then the degradation diagnosis unit 12b gives an alarm.

(S6) When the degradation diagnosis ends, the switch control unit 12a puts the switches sw1 through sw3 into a degradation diagnosis end state (FIG. 9).

In this case, the switch control unit 12a turns on the switch sw1 by the switch control signal c1, turns on the switch sw2 by the switch control signal c2, and turns off the switch sw3 by the switch control signal c3. Both of the backup condenser Cb and the spare condenser Cp are charged.

(S7) When the switch control unit 12a recognizes that the backup condenser Cb has been charged, the switch control unit 12a turn off the switch sw2 by the switch control signal c2. Charging the backup condenser Cb is continued and the spare condenser Cp self-discharges.

Figure 11:
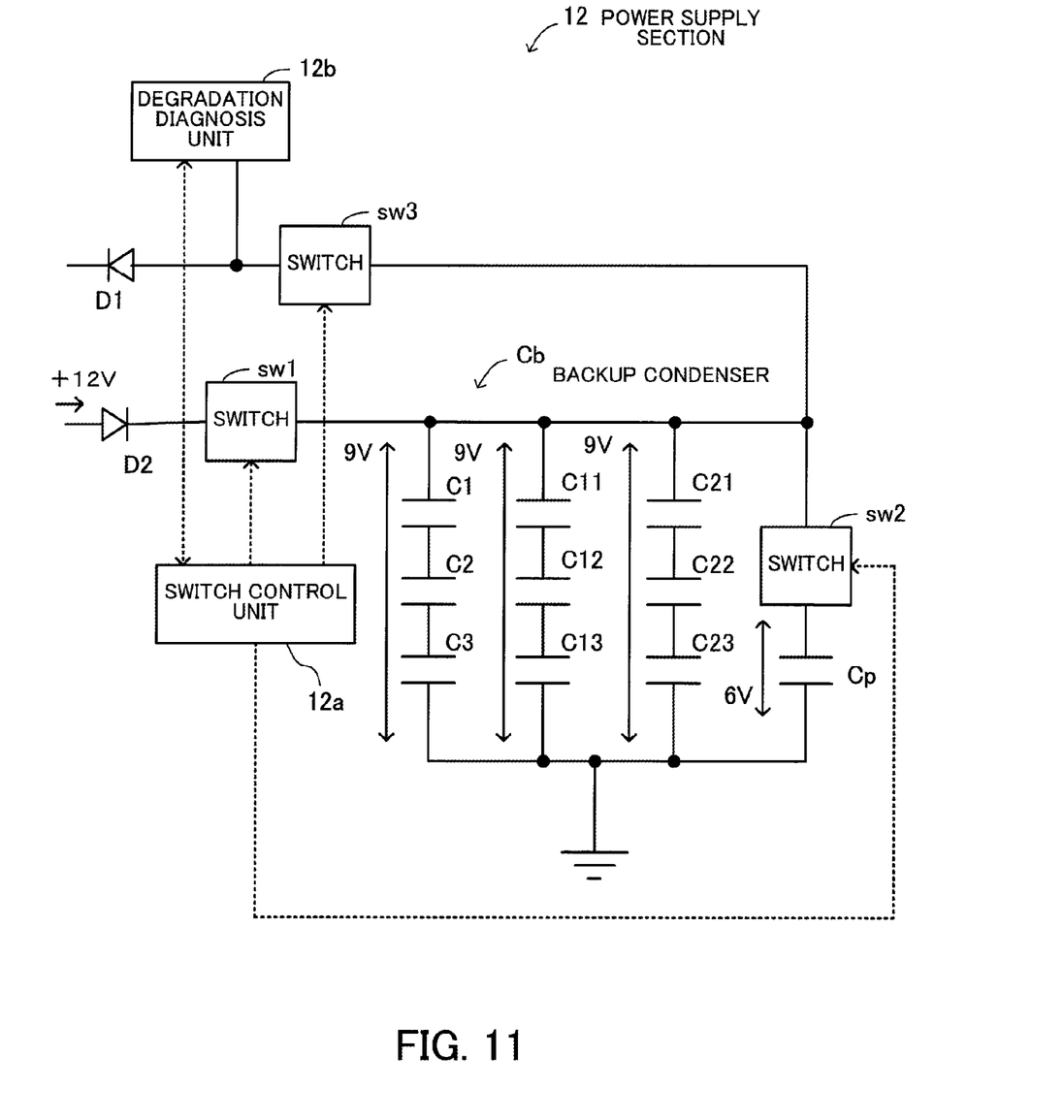
FIG. 11 indicates an example of the relationship between charging voltage of a backup condenser and charging voltage of a spare condenser.

The relationship between charging voltage of the backup condenser Cb and charging voltage of the spare condenser Cp will now be described. FIG. 11 indicates an example of the relationship between charging voltage of the backup condenser and charging voltage of the spare condenser.

It is assumed that a DC voltage of +12 volts is supplied to the power supply section 12. In addition, it is assumed that the maximum rated voltages of the condensers C1 through C3, C11 through C13, and C21 through C23 included in the backup condenser Cb and the spare condenser Cp are 6 V.

In this case, the switch sw1 decreases an input voltage of +12 volts to 9 volts to apply a voltage of 9 volts to the condensers C1 through C3 connected in series, the condensers C11 through C13 connected in series, and condensers C21 through C23 connected in series.

Accordingly, each of the condensers C1 through C3, C11 through C13, and C21 through C23 included in the backup condenser Cb is used at a voltage of 3 volts. Furthermore, the switch sw2 decreases an input voltage of 9 volts to 6 volts to apply a voltage of 6 volts to the spare condenser Cp.

If charging voltage is increased to the maximum rated voltage, degradation advances rapidly. Accordingly, charging voltage of each condenser included in the backup condenser Cb is lower than the maximum rated voltage. On the other hand, the spare condenser Cp is charged at the time of degradation diagnosis of the backup condenser Cb. That is to say, the spare condenser Cp is used only in limited cases. This means that degradation of the spare condenser Cp advances more slowly than degradation of the backup condenser Cb.

Therefore, the maximum rated voltage is applied to the spare condenser Cp. As a result, voltage applied to the spare condenser Cp higher than voltage applied to each condenser included in the backup condenser Cb. A high voltage is applied to the spare condenser Cp, so a large power amount is stored. This makes it possible for the single spare condenser Cp to sufficiently supplement a power amount which decreases in the backup condenser Cb at degradation diagnosis time.

As has been described in the foregoing, in this embodiment a power amount lost from the backup condenser Cb due to a degradation diagnosis of the backup condenser Cb is supplemented in advance by the spare condenser Cp. As a result, the number of condensers included in the power supply section 12 is small compared with a case where a large-scale backup condenser Cb is used only for degradation diagnosis. That is to say, an increase in the number of condensers caused by improving reliability by degradation diagnosis is checked. Furthermore, a decrease in the number of condensers enables a reduction in the size of the power supply section 12. In addition, a decrease in the number of parts reduces power consumption and improves reliability.

In the above embodiment an apparatus using condensers is taken as an example of an apparatus which accumulates electricity. However, the above embodiment is also applicable to an apparatus including a battery for backup. For example, a battery, such as a lead storage battery, also discharges at degradation diagnosis time. Accordingly, the above embodiment is also applicable to an apparatus including a lead storage battery as a capacitive element and the same effect that is obtained in the above embodiment is achieved.

The embodiment has been described in the foregoing. However, each component indicated in the embodiment may be replaced with another unit having the same function. Furthermore, any other component or process may be added.

According to an aspect, an increase in the scale of an apparatus for accumulation of electricity caused by improving reliability is checked.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power supply apparatus comprising:
   a first electric accumulator;
   a second electric accumulator; and
   a control section which controls charge and discharge of the first electric accumulator and the second electric accumulator so as to charge the first electric accumulator and make the second electric accumulator discharge at the time of not performing a degradation diagnosis of the first electric accumulator and so as to charge the second electric accumulator at the time of performing the degradation diagnosis of the first electric accumulator and make, after charging the second electric accumulator, the first electric accumulator begin to discharge for the degradation diagnosis.

2. The power supply apparatus according to claim 1, wherein charging voltage of the second electric accumulator is higher than charging voltage of the first electric accumulator.

3. The power supply apparatus according to claim 1 further comprising:
   a degradation diagnosis section which diagnoses a degraded state of the first electric accumulator;
   a first switch which performs switching of power supply input;
   a second switch which performs switching of charge and discharge of the second electric accumulator; and
   a third switch which performs switching of supply of power discharged by the first electric accumulator to a section to be backed up and input of the power discharged by the first electric accumulator to the degradation diagnosis section,
   wherein the control section controls charge and discharge of the first electric accumulator and the second electric accumulator by controlling the first through third switches.

4. The power supply apparatus according to claim 3, wherein at the time of preparation of performance of the degradation diagnosis of the first electric accumulator, the control section:
   closes the first switch to charge the first electric accumulator by the power supply input; and
   closes the second switch to connect the first electric accumulator and the second electric accumulator in parallel and to charge the second electric accumulator by the power supply input in a state in which supply of the power discharged by the first electric accumulator to the section to be backed up and input of the power discharged by the first electric accumulator to the degradation diagnosis section are shut off by opening the third switch.

5. The power supply apparatus according to claim 3, wherein at the time of performance of the degradation diagnosis of the first electric accumulator, the control section:

opens the second switch to shut off the power supply input to the second electric accumulator and to make the second electric accumulator self-discharge;

opens the first switch to shut off the power supply input to the first electric accumulator; and closes the third switch to input the power discharged by the first electric accumulator to the degradation diagnosis section.

6. The power supply apparatus according to claim 5, wherein at the time of the power supply input being stopped during the performance of the degradation diagnosis of the first electric accumulator, the control section closes the second and third switches to supply both of the power discharged by the first electric accumulator and power discharged by the second electric accumulator to the section to be backed up.

7. The power supply apparatus according to claim 3, wherein at the time of an end of the degradation diagnosis of the first electric accumulator, the control section:

closes the first switch to charge the first electric accumulator by the power supply input;

closes the second switch to connect the first electric accumulator and the second electric accumulator in parallel and to charge the second electric accumulator by the power supply input;

opens the third switch to shut off supply of the power discharged by the first electric accumulator to the section to be backed up and input of the power discharged by the first electric accumulator to the degradation diagnosis section; and opens the second switch to shut off the power supply input to the second electric accumulator and to make the second electric accumulator self-discharge when the control section recognizes that the second electric accumulator has been charged.

8. A power supply degradation diagnosis method in a power supply apparatus including a first electric accumulator and a second electric accumulator, the method comprising:

charging the first electric accumulator and making the second electric accumulator discharge, at the time of not performing a degradation diagnosis of the first electric accumulator;

charging the second electric accumulator at the time of performing the degradation diagnosis of the first electric accumulator; and making the first electric accumulator begin to discharge for the degradation diagnosis after charging the second electric accumulator.

\* \* \* \* \*